United States Patent [19]

Platzer et al.

[11] Patent Number: 4,719,169

[45] Date of Patent: Jan. 12, 1988

[54] PROTECTIVE COATING FOR IMAGES

[75] Inventors: Stephan J. W. Platzer, Califon; Mehmet U. Yener, Rahway; Stanley F. Wanat, Scotch Plains, all of N.J.

[73] Assignee: Hoechst Celanese Corporation, Somerville, N.J.

[21] Appl. No.: 853,782

[22] Filed: Apr. 18, 1986

[51] Int. Cl.⁴ .............................................. G03C 11/12
[52] U.S. Cl. ...................................... 430/258; 430/14; 430/143; 430/257; 430/293; 430/950; 430/961; 156/309.9; 428/40; 428/42; 428/195; 428/200; 428/201; 428/202
[58] Field of Search ............... 430/143, 961, 950, 258, 430/257, 293, 14; 156/309.9; 428/40, 42, 195, 200, 201, 202

[56] References Cited

U.S. PATENT DOCUMENTS

| | | | |
|---|---|---|---|
| 3,721,557 | 3/1973 | Inoue | 430/166 |
| 4,077,830 | 3/1978 | Fulwiler | 430/961 |
| 4,294,641 | 10/1981 | Reed et al. | 428/200 |
| 4,303,718 | 12/1981 | Snelgrove | 428/200 |
| 4,366,223 | 12/1982 | Larson | 430/143 |
| 4,376,159 | 3/1983 | Spechler | 430/293 |
| 4,489,154 | 12/1984 | Taylor | 430/257 |
| 4,522,881 | 6/1985 | Kobayashi et al. | 430/961 |

*Primary Examiner*—Charles L. Bowers, Jr.
*Attorney, Agent, or Firm*—Richard S. Roberts

[57] ABSTRACT

The invention provides a method for protecting an image which comprises providing a colored image on a substrate and either:

A. Applying an antiblocking layer to a release surface of a temporary support; bonding a thermoplastic adhesive layer to said antiblocking layer; laminating said applied support to said colored image via said adhesive; and peeling away said temporary support from said antiblocking layer; or B. applying a thermoplastic adhesive layer to a release surface of a first temporary support; applying an antiblocking layer onto a release surface of a second temporary support, laminating said adhesive onto said colored image and peeling away said first temporary support; and laminating said antiblocking layer onto said adhesive layer and peeling away said second temporary support;

wherein said adhesive layer is substantially nontacky at room temperature, is laminated at temperatures between about 60° C. and 90° C., and comprises one or more thermoplastic polymers or copolymers; and wherein said antiblocking layer comprises one or more organic polymers or copolymers, which layer does not cohesively block at about 50° C. or less.

19 Claims, No Drawings

PROTECTIVE COATING FOR IMAGES

BACKGROUND OF THE INVENTION

In the graphic arts, it is desirable to produce a color proof to assist a printer in correcting a set of photomasks which will be used in exposing printing plates. The proof should reproduce the color quality that will be obtained during the printing process. The proof must be a consistent duplicate of the desired half-tone or line image, and should neither gain nor lose color. Visual examination of a color proof should reveal the following characteristics:

1. Any defects on the photomask.
2. The best color rendition to be expected from press printing of the material.
3. The correct gradation of all colors and whether grays are neutral.
4. The need, if any, for subduing any of the colors and/or giving directions for altering the film photomask before making the printing plates.

Color proofing sheets for multicolored printing have heretofore been made by using a printing press proof which requires taking all the steps necessary for actual multicolor printing. Such a conventional method of color proofing has been costly and time consuming. Color proofing methods have therefore been developed to simulate the quality of press proofs.

In the surprint type of color proofing method, a color proofing sheet is prepared by successively producing images of different colors from different color separation films onto a single receptor sheet. This is done by utilizing a single opaque support and by applying toners, photosensitive solutions or coatings of photosensitive materials of corresponding colors on the opaque support in succession. An example of this approach is described in U.S. Pat. No. 3,671,236. An advantage of the surprint type of color proof is that the color saturation is not influenced by superimposed plastic supports. This method more closely resembles the actual printing and eliminates the color distortion inherent in the overlay system.

Various processes for producing copies of an image embodying photopolymerization and thermal transfer techniques are known as shown in U.S. Pat. Nos. 3,060,023; 3,060,024; 3,060,025 3,481,736; and 3,607,264. In these processes, a photopolymerizable layer coated on a suitable support is imagewise exposed to a photographic transparency. The surface of the exposed layer is then pressed into contact with the image receptive surface of a separate element and at least one of the elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material. U.S. Pat. No. 3,574,049 provides a transfer process for printing a design on a final support which comprises (a) printing a design onto a temporary support, (b) superimposing the temporary support and the final support, (c) applying heat and/or pressure to the superimposed structure formed in (b), and (d) separating the temporary support from the final support which retains the printed design. The affinity of the design for the temporary support is lower than its affinity for the final support.

In U.S. Pat. No. 3,721,557 a method of transferring colored images is claimed which provides a stripping layer coated between the photosensitive element and the support. When the photosensitive layer is exposed to actinic light and developed, the more soluble portions are selectively removed to produce a visible image. The image-carrying support is pressed against a suitable adhesive coated receptor member and, subsequently, the carrier support sheet is stripped to accomplish the transfer of the image. A fresh layer of adhesive is applied to the receptor for each subsequent transfer.

One problem with such surprint type proofing systems is the image is vulnerable to damage from its environment, i.e., from fingerprints, scratches, dust and the like.

In order to protect the surface of the surprint proof, it is commonly the practice to laminate to such surface a thin transparent film of polyester or the like, or a layer of photopolymer which may be polymerized by overall exposure to actinic radiation to form a tough, protective membrane. This postexposure requires an additional processing step. These prior practices, however, generally result in the formation of a thick, glossy surface on the surprint which in some circumstances detracts from the desired appearance of the proof. In many instances, for example, it is preferred that the surface of a multilayer proof print exhibit a matte, or non-glossy, texture in order to closely resemble actual printing on stock which lacks a coated or natural sheen.

Various means have been attempted to reduce the glossy appearance of the noted type of surprint proof, yet none has proven sufficiently simple and effective. The application to the surface of the print of powdered pigments, pigmented sprays or lacquers, or aqueous dispersions of pigments, all as mentioned, for example in U.S. Pat. No. 4,286,046, poses problems of expense, cleanliness, and health while failing to provide a matte of acceptable uniformity, texture, and appearance.

The present invention solves these problems by providing a lamination of thin adhesive and antiblocking layers to the surface of the proof. These layers are borne on one or two temporary supports and are then laminated to the proof. The temporary supports are then stripped off. The proof is itself thereby provided with either a smooth or matte finish depending upon the surface topography of the temporary support from which the aforementioned layers were removed.

SUMMARY OF THE INVENTION

The invention provides a method for protecting an image which comprises providing a colored image on a substrate and either:

A. Applying an antiblocking layer to a release surface of a temporary support; bonding a thermoplastic adhesive layer to said antiblocking layer; laminating said applied support to said colored image via said adhesive; and peeling away said temporary support from said antiblocking layer; or B. applying a thermoplastic adhesive layer to a release surface of a first temporary support; applying an antiblocking layer onto a release surface of a second temporary support, laminating said adhesive onto said colored image and peeling away said first temporary support; and laminating said antiblocking layer onto said adhesive layer and peeling away said second temporary support;

wherein said adhesive layer is substantially nontacky at room temperature, is laminated at temperatures between about 60° C. and 90° C., and comprises one or more thermoplastic polymers or copolymers; and wherein said antiblocking layer comprises one or more organic polymers or copolymers, which layer does not cohesively block at about 50° C. or less.

DETAILED DESCRIPTION OF THE PREFERRED EMBODIMENT

In carrying out the method of the invention, one employs a photographic element which broadly comprises a substrate having a colored photographic image thereon. Such photographic elements are not per se new.

In the preferred embodiment, the substrate is composed of a dimensionally and chemically stable base material which does not significantly change its size, shape or chemical properties as the result of the heated lamination or other treatments which it must undergo. One preferred material is polyethylene terephthalate. In the usual case it has a thickness of from about 1 to about 10 mils, a more preferred thickness is from about 2-5 mils and most preferably from about 2-3 mils. Suitable films include Hostaphan 3000, available from American Hoechst Corporation; Mylar D, available from DuPont; and Melinex grades 0, 052, 442, 516 and S, available from ICI.

Bonded to the surface of the substrate is a colored photographic image. In the preferred embodiment this image is comprised of four individual color separated images which are adhered to one another to form a full color representation of an image. Each image usually comprises a colored photosensitive material which has been imagewise exposed and developed.

The photosensitive layer broadly comprises a photosensitizer, a colorant, a binding resin, and other optional ingredients such as plasticizers, acid stabilizers, surfactants, anti-static compositions, uv absorbers and residual coating solvents.

The photosensitizer is preferably a light sensitive, polymeric diazonium salt, diazide, or photopolymerizable or photocrosslinkable composition as are well known in the art. The preferred diazide is the ester of bis-(3-benzoyl-4,5,6,trihydroxy phenyl) methane and 2-diazo-1-naphthol-5-sulfonic acid as taught in U.S. Pat. No. 4,407,426. Other suitable diazides are taught in U.S. Pat. Nos. 4,266,001; 3,106,365; 3,148,983; and 3,201,239. The most preferred photosensitizer is the polycondensation product of 3-methoxy-4-diazo-diphenyl amine sulfate and 4,4'-bis-methoxy methyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferably soluble in organic solvents.

Suitable binding resins include polyvinyl butyral and styrene maleic anhydride copolymer half esters, diacids and mixtures thereof. Such resins include Butvar B72, B76 and B90 and Scripset 540 and 550, respectfully, all available from Monsanto. An important resin selection criterion is that it must be a good film former.

The colorants useful for the present invention include various classes of dyes and pigments. In the most preferred embodiment, pigments having an average particle size of about 1 micrometer or less are used.

Optional plasticizers which may be incorporated into the photosensitive layer include those of the phthalate and phosphate types. Preferred plasticizers include di-butyl phthalate and dimethyl phthalate. Acid stabilizers include phosphoric acid and p-toluene sulfonic acid.

These ingredients may be blended with such compatible coating solvents as ethanol, methyl cellosolve diacetone alcohol, gamma butyrolactone, propylene glycol monomethyl ether, and methyl ethyl ketone.

The photosensitive layer is preferably bonded to its substrate by a suitable adhesive such as polyvinyl acetate.

According to the present invention, it is desired to protect the aforesaid photographic image from scratches, dirt and the like due to handling and transportation. An objective is to produce a thin, durable protective layer for the image layer. Thick protective layers are easy to handle but optically distort the image. If a thick protective layer is laminated with heat and pressure to the image layer, the protected image layer will curl considerably when the thermal expansion of the protective layer is different from that of the image layer plus base material.

It is therefore desirable to laminate with pressure to the image layer at a relatively low temperature. Since excessive temperatures can distort and discolor the image.

An additional objective is that the protective layer be substantially nonblocking over extended storage periods.

In general, the protective member to be applied to the image comprises an adhesive layer which is laminated directly to the surface of the image and an antiblocking layer which is adhered to the upper surface of the adhesive layer. These may be applied in either of the following manners.

The adhesive and antiblocking layers can be applied individually or together. If applied individually, the two layers must release from the temporary supports after lamination. The adhesive forces of the adhesive and antiblocking layers to their respective temporary supports must be weaker than the adhesive forces between the image and adhesive layers and between the adhesive and antiblocking layers. They must also be weaker than the cohesive forces of the image layer, adhesive layer, anti-blocking layer, and temporary supports. The adhesive layer on a temporary support can be applied first to the antiblocking layer on a different support with subsequent removal of the adhesive temporary support. The adhesion between the adhesive layer and its temporary support must be weaker than the adhesive forces between the antiblocking layer and its temporary support after lamination. The composite of adhesive layer, antiblocking layer, and antiblocking temporary support is then applied to the image layer with the adhesive layer in direct contact with the image layer. The antiblocking temporary support is subsequently removed.

When the adhesive and antiblocking layers are applied individually, it is preferred that the adhesive layer on a temporary support be applied first to the image layer with subsequent removal of the adhesive temporary support. The antiblocking layer on a temporary support is then applied to the adhesive layer with subsequent removal of the antiblocking temporary support.

In the preferred embodiment, the adhesive and antiblocking layers are together on the same temporary support. The layers are in direct contact with each other. The antiblocking layer is in direct contact with the temporary support. It must be able to release from the temporary support after lamination. The adhesive forces of the antiblocking layer to the temporary support must be weaker than the adhesive forces between the adhesive and antiblocking layers, and between the adhesive and image layers. It must also be weaker than the cohesive forces of the image layer, adhesive layer, antiblocking layer, and temporary support. In this case, the composite of adhesive and antiblocking layers on a temporary support is applied to an image layer with subsequent removal of the temporary support. The adhesive layer is in direct contact with the image layer.

The individual adhesive and antiblocking layers can be protected from dirt by using interleaving material, which is removed prior to lamination. The adhesive forces between the interleaving and adhesive layer and between the interleaving and antiblocking layer must be weaker than the adhesive forces between the adhesive layer and its temporary support and between the antiblocking layer and its temporary support, respectively. They must also be weaker than the cohesive forces of the interleaving, adhesive layer, antiblocking layer, and temporary supports. In the preferred embodiment, interleaving material is placed in direct contact with the adhesive layer of the adhesive-antiblocking composite on a temporary support. The interleaving material is stripped off before lamination of the composite to the image layer.

In the preferred embodiment, the temporary supports comprise a material which is dimensionally stable under laminating conditions. These include polyesters, particularly polyethylene terephthalate. The supports may be transparent or opaque, clear or colored.

The surface of the substrate may be smooth or may be provided with a matte texture by various methods known in the art. Smooth films include Melinex 516 from ICI.

Matte films include Melinex 329, 377 and 470 from ICI. One can control the gloss of the final image by properly selecting the matte finish of the temporary support for the antiblocking layer.

For a matte finish, the layer is laminated to the final image via the adhesive/antiblocking layers under pressure and temperature. Then the film with the rough surface is peeled off. The rough surface imparts a matte finish to the final image. The texture of the protected image layer can be further modified by subsequent laminations with a textured material which is removed after lamination. It can also be modified by subsequent treatment with solvents and/or particles which remove part of the protective layer.

In all cases, the substrate must have a release surface, that is, it must be capable of releasably holding the antiblocking layer thereto. This may be accomplished either by the substrate surface being inherently releasable, being rendered releasable by a suitable treatment or being provided with a release layer over the substrate surface. Such a release layer may comprise polyvinyl alcohol.

The adhesive layer preferably has a thickness of from about 0.5 to about 30 μm, more preferably from about 1 to about 20 μm and most preferably from about 5 to about 15 μm.

The major portion of the adhesive layer is a thermoplastic polymer or mixture of thermoplastic polymers which is substantially nontacky at ordinary room temperatures. The polymers can be selected from thermoplastic polymers which have a glass transition temperature (Tg) preferably between about 20° and about 60° C., more preferably between about 25° and about 55° C. The thermoplastic polymers should form flexible films.

They should preferably be transparent and colorless. The adhesive layer can also contain plasticizers, UV absorbers, surfactants, antistatic compositions, and colorants. Example of polymeric plasticizer include Resoflex R296 available from Cambridge Industries.

Examples of suitable adhesive materials include polyvinyl acetals, such as Butvar B79 available from Monsanto; polyvinyl acetates such as Mowilith 30 available from American Hoechst Corporation; polyvinyl acrylates such as Elvacite 2044 available from DuPont; cellulose nitrate such as RS ½ available from Hercules; polyvinyl chloride/polyvinyl acetate copolymers such as UCAR VYNC available from Union Carbide. Novolaks and epoxy resins can also be used.

The antiblocking layer preferably has a thickness of from about 0.2 to about 50 μm, more preferably from about 1 to about 10 μm and most preferably from about 2 to about 3 μm. The major portion of the antiblocking layer is an organic polymer or mixture of organic polymers. The ingredients in the antiblocking layer are selected so that the layer does not cohesively block at about 50° C. or less, preferably at about 70° C. or less. Standard methods are used to test for cohesive blocking, such as described in ASTM D1146.

The polymer(s) in the antiblocking layer can be selected from polymers which have a glass transition temperature preferably above about 60° C., more preferably above 70° C., most preferably above 100° C. The polymers in the antiblocking layer should form flexible films. They should preferably be transparent and colorless, but can also contain plasticizers, UV absorbers, surfactants, antistatic compositions, and colorants. Example of polymeric plasticizer include Carboset 525 from BF Goodrich.

Examples of antiblocking compounds include styrene maleic anhydride copolymers such as Scripset 540 available from Monsanto; polyvinyl acetals such as Butvar B90 from Monsanto; polyvinyl acrylates such as Elvacite 2008 available from DuPont; polyvinyl acetate/polyvinyl chloride copolymers such as Hostaflex CM 131 from American Hoechst Corporation.

The antiblocking layer and the adhesive layer may be applied by any means known in the art such as coating or laminating.

Lamination of the support/antiblocking/adhesive structures to the photographic image, or the support/adhesive to image and then support/antiblocking to adhesive, is conducted under heat and pressure.

Lamination may be conducted by putting the image in contact with the adhesive side of the composite and then introducing the two materials into the nip of a pair of heated laminating rollers under suitable pressure. Suitable laminating temperatures usually range from about 60° C. to about 90° C., preferably about 75° C. to about 85° C. After lamination, the temporary support is peeled away, usually merely employing manual peeling forces. The adhesive and antiblocking layers thus remain on the imaged sheet.

The following nonlimiting examples serve to illustrate the invention.

EXAMPLE 1

The components in the following antiblocking layer formulation are added in order to a vessel.
39% methyl cellosolve
39% methyl ethyl ketone
10% gamma butyrolactone
10% Scripset 540 (Tg=133° C.)

2% Carboset 525

The second polymer is not added until the first polymer is in solution. The solution is stirred for at least 1 hour at room temperature until all of the materials are dissolved. It is coated onto a 0.003 inch thick sheet of Melinex 377 to a dry coating weight of 3g/m². Melinex 377 is a polyester film from ICI with a matte, untreated surface. It is dried with forced air at 85° C. for 1 minute.

The ingredients in the following adhesive layer formulation are added in order to a clean vessel.
50% n-butyl acetate
50% UCAR VYNC in isopropyl acetate (Tg=51° C.; Union Carbide)

The solution is stirred for a least 1 hour at room temperature. The solution is coated on top of the antiblocking layer to a dry coating weight of 12 g/m². The composite is dried at 85° C. for 90 seconds. The adhesive side of the protective composite on the temporary support is placed in direct contact with a four color image layer. The lamination occurs by introducing the two materials into the nip of a pair of heated laminating rollers at 75° C. under suitable pressure. After lamination, the temporary support is peeled away. The adhesive and antiblocking layers thus remain on the four color imaged layer. The Melinex 377 imparts a rough texture to the surface of the antiblocking layer. The protected image layer does not cohesively block at 70° C. under a 1 pound per square inch load over a 24 hour period.

EXAMPLE 2

The components in the following antiblocking layer formulation are added in order to a vessel.
42% methyl cellosolve
42% methyl ethyl ketone
10% gamma butyrolactone
6% Butvar B-90 (Tg=65° C.)

The solution is stirred for a least 3 hours at room temperature until all of the polymer is dissolved. It is coated onto a 0.003 inch thick sheet of Melinex 516 to a coating weight of 1 g/m². Melinex 516 is a high clarity polyester film from ICI with a smooth, untreated surface. The coating is dried at 85° C. for 1 minute.

The ingredients in the following adhesive layer formulation are added in order to a clean vessel.
78% n-butyl acetate
21% Mowilith 30 (Tg=28° C.)
1% Resoflex R296

The solution is stirred for at least 4 hours at room temperature. The solution is coated on top of the antiblocking layer to a coating weight of 10g/m². It is dried at 85° C. for 90 seconds. A #7 Bauer interleaving paper is used to protect the adhesive side of the composite from dirt. Before lamination, the interleaving paper is removed. The adhesive side of the protective composite on the temporary support is placed in direct contact with a four color image layer. The lamination occurs by introducing the two materials into the nip of a pair of heated laminating rollers at 75° C. under suitable pressure. After lamination, the temporary support is peeled away. The adhesive and antiblocking layers thus remain on the four color image layer. The Melinex 516 imparts a glossy surface to the top surface of the antiblocking layer. The composite of antiblocking, adhesive, and image layers is laminated further with Melinex 377 in contact with the antiblocking layer, with subsequent removal of the Melinex 377. This imparts a semimatte texture to the top surface of the protected image layer. The protected image layer does not cohesively block at 50° C.

EXAMPLE 3

A protected image layer is prepared as in Example 1. The material is placed on a flat surface in a tray. A nonwoven cotton pad is wrapped around a developing block and soaked in a aqueous solution of sodium hydroxide at pH=12.5. The soaked pad is gently rubbed over the protected image layer to partially remove the antiblocking layer. The protected image layer is rinsed with water for 20 seconds. It is laid down onto lint-free paper and then blotted dry on the backside of the image layer. The aqueous treatment removes some of the rough texture on the top surface of the antiblocking layer.

EXAMPLE 4

The adhesive/antiblocking composite on the temporary support is prepared as in Example 1. A four color image layer is made according to U.S. Pat. No. 3,671,236. The adhesive side of the composite is placed in direct contact with the image layer. The two materials are laminated through a pair of heated laminating rollers at 75° C. under suitable pressure. After lamination, the temporary support is stripped off. The adhesive and antiblocking layers thus remain on the four color image layer.

EXAMPLE 5

The component in the following anti-blocking layer formulation are added in order to a beaker.
85% methyl ethyl ketone
15% Hostaflex CM131 (Tg=75° C.)

The solution is stirred for at least 3 hours at room temperature until all of the materials are dissolved. It is coated onto a 0.003 inch thick sheet of Melinex 470 to a coating weight of 3g/m² using a Meier bar. The coating is dried at 100° C. for 1 minute. Melinex 470 is a high yield polyester from ICI with an untreated surface.

A solution containing the chemicals in the following adhesive layer formulation is coated onto a 0.004 inch thick sheet of Hostaphan 3000 to a coating weight of 18g/m² using a Meier bar.
78% n-butyl acetate
21% Mowilith 30
1% Resoflex R296

Hostaphan 3000 is a high clarity polyester from Hoechst with a slip treated surface. The coating is dried at 100° C. for 3 minutes. The adhesive side of the adhesive layer on its temporary support is placed in direct contact with a four color image layer.

The lamination occurs by introducing the two materials into the nip of a prior of heated laminating rollers at 75° C. under suitable pressure. After lamination, the adhesive temporary support is peeled away. Next, the antiblocking layer on its temporary support is placed in direct contact with the adhesive layer. The two materials are laminated together under the same laminating conditions. The antiblocking temporary support is peeled away after lamination. Adhesive and antiblocking layers thus remain on the four color imaged layer. The Melinex 470 imparts a fine texture to the surface of the antiblocking layer. The protected image layer does not cohesively block 50° C.

EXAMPLE 6

Example 1 is repeated except the following adhesive is used.
64% n-butyl acetate
10% Mowilith 30
1% Resoflex R296
25% UCAR VYNC in isopropyl acetate
Similar results are observed.

EXAMPLE 7

Example 1 is repeated except the following antiblocking layer is used.
9% gamma butyrolactone
35% methyl ethyl ketone
34% methyl cellosolve
8% Scripset 540
2% Carboset 525
11% n-butyl acetate The protected image layer does not cohesively block at 70° C.

EXAMPLE 8

Example 1 is repeated except the coating weight for the antiblocking layer is 5g/m² and the coating weight of the adhesive layer is 11 g/m². Similar results are observed.

EXAMPLE 9

The component in the following antiblocking layer formulation are added in order to a beaker.
20% methyl ethyl ketone
67% n-butyl acetate
12% Hostaflex CM131
1% Resoflex R296

The solution is stirred for at least 3 hours at room temperature until all of the materials are dissolved. It is coated onto a sheet of Melinex 377 to a coating weight of 5g/m² using a Meier bar. The coating is dried at 85° C. for 1 minute.

A solution containing the chemicals in the following adhesive layer formulation is coated onto a sheet of Melinex 516 to a coating weight of 12g/m² using a Meier bar.
78% n-butyl acetate
21% Mowilith 30
1% Resoflex R296

The coating is dried at 85° C. for 90 seconds. The adhesive side of the adhesive layer on its temporary support is placed in direct contact with a four color image layer.

The lamination occurs by introducing the two materials into the nip of a pair of heated laminating rollers at 75° C. under suitable pressure. After lamination, the adhesive temporary support is peeled away. Next, the antiblocking layer on its temporary support is placed in direct contact with the adhesive layer. The two materials are laminated together under the same laminating conditions. The antiblocking temporary support is peeled away after lamination. Adhesive and antiblocking layers thus remain on the four color imaged layer. The Melinex 377 imparts a rough texture to the top surface of the antiblocking layer.

EXAMPLE 10

Example 9 is repeated except the antiblocking layer is coated onto a sheet of Melinex 516. Similar results are noted except a glossy texture is imparted to the surface of the antiblocking layer.

EXAMPLE 11

Example 1 is repeated except the following antiblocking solution is applied to the roughened surface of Melinex 377 at a coating weight of 5g/m².
65% n-butyl acetate
20% methyl ethyl ketone
1% Resoflex R296
0.4% Mowilith 30
13.6% Hostaflex CM-131

The antiblocking layer is over coated with the following adhesive solution at a coating weight of 12g/m².
79% n-butyl acetate
1% Resoflex R296
20% Mowilith 30

The protected image layer does not cohesively block at 50° C.

What is claimed is:

1. A method for protecting an image with a thin, substantially non-blocking protective layer which comprises providing a colored image on a substrate and either:

A. Applying an antiblocking coating to a release surface of a temporary support; bonding a thermoplastic adhesive layer to said antiblocking coating; laminating said applied support to said colored image via said adhesive; and peeling away said temporary support from said antiblocking coating; or B. applying a thermoplastic adhesive layer to a release surface of a first temporary support; applying an antiblocking coating onto a release surface of a second temporary support, laminating said adhesive onto said colored image and peeling away said first temporary support; and laminating said antiblocking coating onto said adhesive layuer and peeling away said second temporary support;

wherein said adhesive layer is transparent, colorless and substantially nontacky at room temperature, is laminated with pressure such that the adhesive is directly on the surface of the image and the antiblocking coating is on the other surface of the adhesive, at temperatures between about 60° C. and 90° C.; and comprises in a major portion one or more thermoplastic polymers or copolymers capable of forming a flexible film; and wherein said antiblocking coating is transparent, colorless and comprises one or more organic polymers or copolymers, which coating does not cohesively block at about 50° C. or less; and wherein said lamination is conducted at a temperature of from about 60° C. to about 90° C.

2. The method of claim 1 wherein the temporary support or supports of claim 1 comprise polyethylene terephthalate.

3. The method of claim 1 wherein the surface of the temporary support adjacent said antiblocking coating has a matte texture.

4. The method of claim 1 wherein the surface of the temporary support adjacent said antiblocking coating has a glossy texture.

5. The method of claim 1 wherein said adhesive coating has a thickness of from about 0.5 to about 30 μm.

6. The method of claim 1 wherein said antiblocking coating has a thickness of from about 0.2 to about 50 μm.

7. The method of claim 1 wherein said polymer(s) in the antiblocking coating has a Tg of about 60° C. or more.

8. The method of claim 1 wherein said polymer(s) in the antiblocking coating has a Tg of about 70° C. or more.

9. The method of claim 1 wherein said polymer in the antiblocking coating has a Tg of about 100° C. or more.

10. The method of claim 1 wherein said thermoplastic polymer(s) in the adhesive coating has a Tg of from about 20° C. to about 60° C.

11. The method of claim 1 wherein said thermoplastic polymer(s) in the adhesive coating has a Tg of from about 25° C. to about 55° C.

12. The method of claim 1 wherein said adhesive coating comprises one or more materials selected from the group consisting of polyvinyl acetals, polyvinyl acetates, polyvinyl acrylates, cellulose nitrate, polyvinyl chloride/polyvinyl acetate copolymers, novolaks and epoxy resins.

13. The method of claim 1 wherein said antiblocking coating comprises one or more compounds selected from the group consisting of styrene-maleic anhydride copolymers, polyvinyl acetals, polyvinyl acrylates, and polyvinyl acetate/polyvinyl chloride copolymers.

14. The method of claim 1 wherein said lamination is conducted at a temperature of from about 75° C. to about 85° C.

15. The method of claim 1 wherein said antiblocking coating does not cohesively block at about 70° C. or less.

16. The method of claim 1 wherein said adhesive coating has a thickness of from about 1 to about 20 μm.

17. The method of claim 1 wherein said adhesive coating has a thickness of from about 5 to about 15 μm.

18. The method of claim 1 wherein said antiblocking coating has a thickness of from about 1 to about 10 μm.

19. The method of claim 1 wherein said antiblocking coating has a thickness of from about 2 to about 3 μm.

* * * * *